United States Patent
Zhao et al.

(10) Patent No.: US 7,821,624 B2
(45) Date of Patent: Oct. 26, 2010

(54) TRACKING SYSTEM WITH EXCITED STATE ATOMIC LINE FILTER

(75) Inventors: Zhong-Quan Zhao, San Diego, CA (US); Daniel H. Leslie, Encinitas, CA (US); Michael Joseph Lefebure, Del Mar, CA (US)

(73) Assignee: Trey Enterprises Corp., San Diego, CA (US)

( * ) Notice: Subject to any disclaimer, the term of this patent is extended or adjusted under 35 U.S.C. 154(b) by 816 days.

(21) Appl. No.: 11/447,500

(22) Filed: Jun. 5, 2006

(65) Prior Publication Data
US 2006/0285569 A1    Dec. 21, 2006

Related U.S. Application Data

(63) Continuation-in-part of application No. 10/682,567, filed on Oct. 9, 2003, now Pat. No. 7,058,110.

(51) Int. Cl.
*G01B 11/26* (2006.01)

(52) U.S. Cl. .................................. 356/139.04

(58) Field of Classification Search ....... 356/3.01–3.15, 356/4.01–4.1, 5.01–5.15, 6–22
See application file for complete search history.

(56) References Cited

U.S. PATENT DOCUMENTS 5,029,999 A * 7/1991 Kremer et al. ............. 356/5.09
5,502,558 A * 3/1996 Menders et al. ............ 356/28.5
6,151,340 A * 11/2000 Rivers ....................... 372/32

* cited by examiner

*Primary Examiner*—Thomas H Tarcza
*Assistant Examiner*—Luke D Ratcliffe
(74) *Attorney, Agent, or Firm*—John R. Ross

(57) ABSTRACT

A tracking system utilizing an excited state atomic line filter. The filter includes a metal vapor cell having an optical entrance port and an optical exit port and containing a metal vapor having a first excited energy state with a resonant frequency, and a second excited energy state. The cell has an absorption line, at or near a desired filter wavelength. The platform to be tracked, which could be an un-manned aerial vehicle has a beacon laser system located on it for producing a beacon laser beam at a wavelength within the narrow spectral band. The present invention solves the problem of lack of ground state resonant lines in at wavelengths substantially longer than those of visible light. Atomic line filters of the Faraday or Voigt crossed polarizer type are provided in which alkali metal atomic vapor in a vapor cell is excited with a pump beam to an intermediate excited state where a resonant absorption line, at a desired wavelength, is available. A magnetic field is applied to the cell producing a polarization rotation for polarized light at wavelengths near the resonant absorption lines. Thus, all light is blocked by the cross polarizers except light near one of the spaced apart resonant lines. However, the polarization of light at certain wavelengths near the resonant is rotated in the cell and therefore passes through the output polarizer.

18 Claims, 14 Drawing Sheets

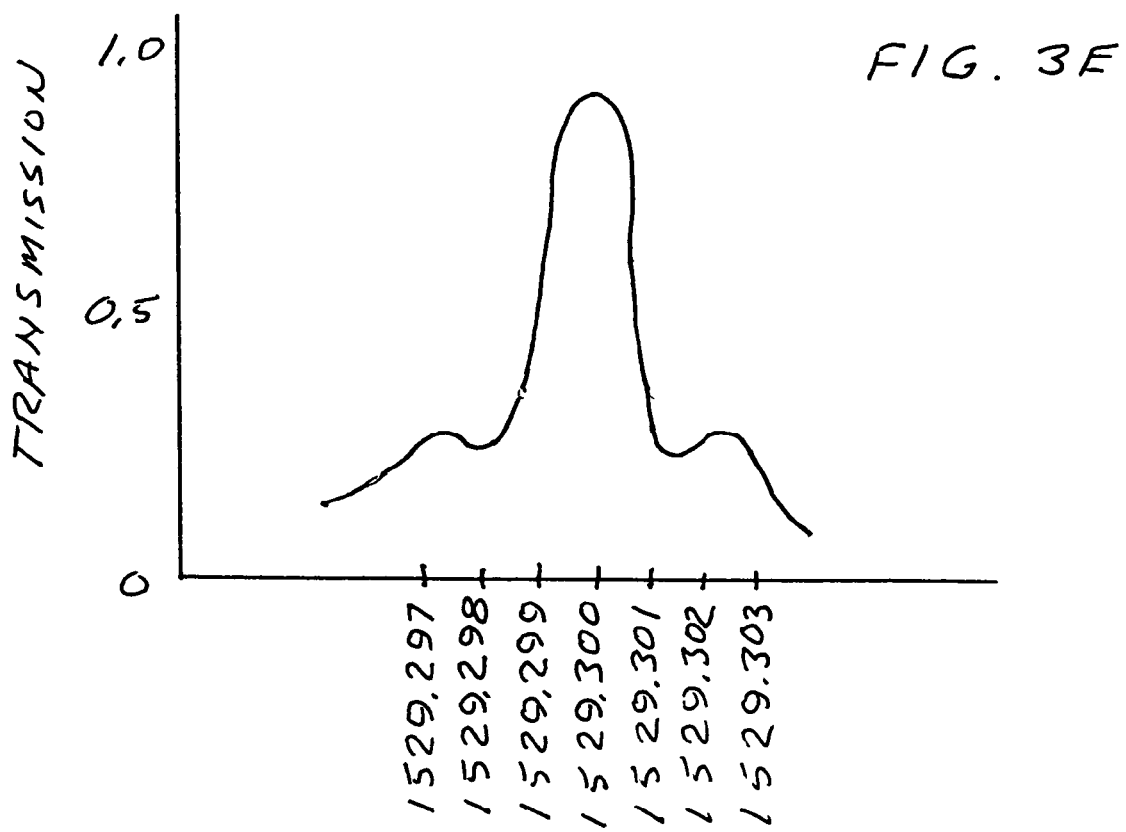

Rb Atomic Line Filter at 1529.3 nm

Rb vapor temperature: 120 °C
Rb cell length: 1 cm
Magnetic field Strength: 140 Gauss
Pump laser Wavelength: 780.24 nm (vaccum)
Pump power: 10.8 mW
Pump laser effectivé area: 0.778 mm²

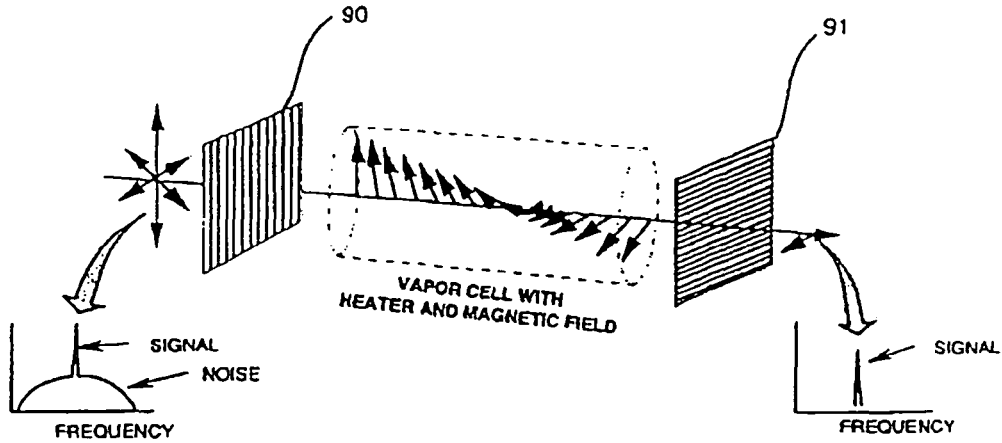
Fig. 7B  Fig. 7A  Fig. 7C
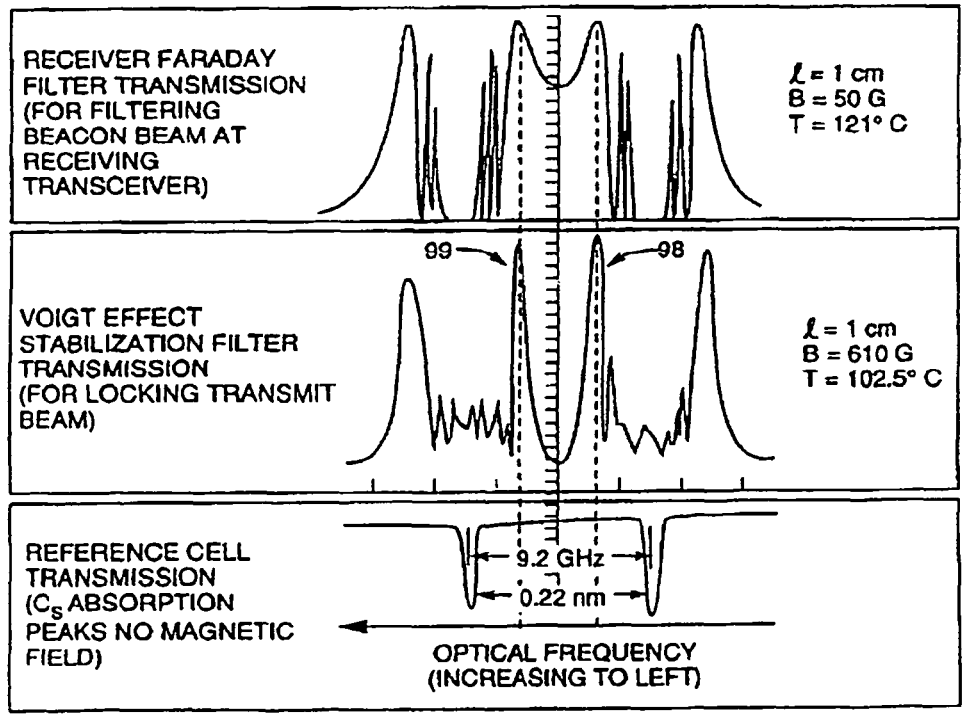

TRACKING SYSTEM WITH EXCITED STATE ATOMIC LINE FILTER

The present invention related to tracking systems and optical filters, especially to atomic line filters (ALF). This application is a continuation in part of Ser. No. 10/682,567 filed Oct. 9, 2003 soon to issue as U.S. Pat. No. 7,058,110.

BACKGROUND OF THE INVENTION

Atomic line filters are a class of optical filters which have acceptance bandwidths on the order of 0.001 nm. In one prior art type of ALF, broadband light containing narrowband signal light is passed through a first color glass filter which cuts off light at wavelengths below a threshold value. The signal and remaining noise light enter an atomic vapor that only absorbs the signal light within the atom's 0.001 nm acceptance bandwidth thereby exciting those absorbing atoms to an intermediate energy level. A pump beam further excites those atoms to a second, higher energy level that then decays through various processes including fluorescence, to the ground state of the atom. The emitted fluorescence occurs at wavelengths below the threshold value of the first color glass filter. A second color glass filter then cuts off any wavelengths above the threshold which effectively permits passage of only the emitted narrowband fluorescence. In effect, the incoming signal has been internally shifted in wavelength by the atomic vapor, which then allows the use of two overlapping color glass filters to block any background radiation.

Another type of prior art atomic line filter takes advantage of either the Faraday effect or the Voigt effect where an atomic vapor in a magnetic field produces polarization rotation in order to pass a narrow spectral band of light through two crossed polarizers. These filters are known respectively as Faraday filters or Voigt filters. An important use for these filters is to block background light so that a beacon laser beam can be detected by a wide field-of-view detector.

Operational principles of Faraday filters can be understood by reference to FIGS. 7A-C. Crossed polarizers 90 and 91 serve to block out background light with a rejection ratio better than $10^{-5}$. Because these polarizers only work over a limited wavelength region in the infrared, a broad band interference filter may be used in conjunction with the Faraday filter. Between the polarizers, an atomic vapor (which in many of these filters is cesium or rubidium) in a magnetic field axially aligned with the path of the beam, rotates the polarization of the laser signal by 90°, while leaving background light at other wavelengths unrotated, and thus blocked by the polarizers.

In the case of the Faraday filter the magnetic field is applied in the direction of the signal beam, and in the case of the Voigt filter the magnetic field is applied perpendicular to the signal beam direction and at 45 degrees to the direction of each of the two cross polarizers.

Prior art atomic line filters patents issued to co-workers of applicant includes U.S. Pat. Nos. 4,983,844; 5,267,010; 5,502,558; 5,731,585 and 6,151,340 each of which are incorporated herein by reference. The '844 patent discloses a fast atomic line filter which utilizes a pump laser and a high voltage potential to produce ion pairs from atoms excited by photons with wavelengths corresponding to a resonant frequency. The other patents describe applications of Faraday and/or Voigt filters.

One problem with atomic line filters such as those referred to above is that their operation depends on the existence of a good sharp resonant absorption line near the spectral range to be filtered. Many of these sharp resonant absorption lines are characteristic of atomic vapors and the filters described in the above referenced patents utilize alkali metals such as cesium and rubidium to produce these metal vapors. These metals are preferred because their vapors may be produced at relatively low temperatures. However, good absorption lines from these alkali metal vapors are generally in the visible and the near visible spectral region such as 780 nm and 852 nm.

Many optical symptoms operate at wavelengths substantially longer than the visible and near visible. A good example is light with wavelengths in the range of 1.5 micron. For example, fiber optic communication is typically at wavelengths in the range of about 1.2 micron to about 1.65 microns (see FIG. 5). Typical long haul filter optics operate within a C or L band. (C band is 1520 nm to 1570 nm, and L band is 1570 nm to 1620 nm). Shorter range fiber optics requiring higher quality fiber optics may operate within an s band (1.31-1.48 microns). Also, there is a need for filters at even longer wavelength such as about 1.5 to 5 microns for laser tracking and for free space laser communications. Applicants have searched for good resonance lines in the alkali metals at these wavelengths without success.

SUMMARY OF THE INVENTION

The present invention provides a tracking system utilizing an excited state atomic line filter. The filter includes a metal vapor cell having an optical entrance port and an optical exit port and containing a metal vapor having a first excited energy state with a resonant frequency, and a second excited energy state. The cell has an absorption line, at or near a desired filter wavelength. The platform to be tracked, which could be an un-manned aerial vehicle has a beacon laser system located on it for producing a beacon laser beam at a wavelength within the narrow spectral band. The present invention solves the problem of lack of ground state resonant lines in at wavelengths substantially longer than those of visible light. Atomic line filters of the Faraday or Voigt crossed polarizer type are provided in which alkali metal atomic vapor in a vapor cell is excited with a pump beam to an intermediate excited state where a resonant absorption line, at a desired wavelength, is available. A magnetic field is applied to the cell producing a polarization rotation for polarized light at wavelengths near the resonant absorption lines. Thus all light is blocked by the cross polarizers except light near one of the spaced apart resonant lines. However, the polarization of light at certain wavelengths near the resonant is rotated in the cell and therefore passes through the output polarizer.

BRIEF DESCRIPTION OF THE DRAWINGS

FIG. 3E shows expected transmission curve for the FIG. 3 embodiment.

FIG. 7A shows features of a prior art Faraday filter.

FIG. 7B shows features of a prior art Faraday filter.

FIG. 7C shows features of a prior art Faraday filter.

FIG. 8A show prior art Faraday and Voigt results.

FIG. 8B shows prior art Faraday and Voigt results.

FIG. 8C shows prior art Faraday and Voigt results.

DETAILED DESCRIPTION OF PREFERRED EMBODIMENTS

Prototype Results

Cesium Vapor Cell

Figure 1A:
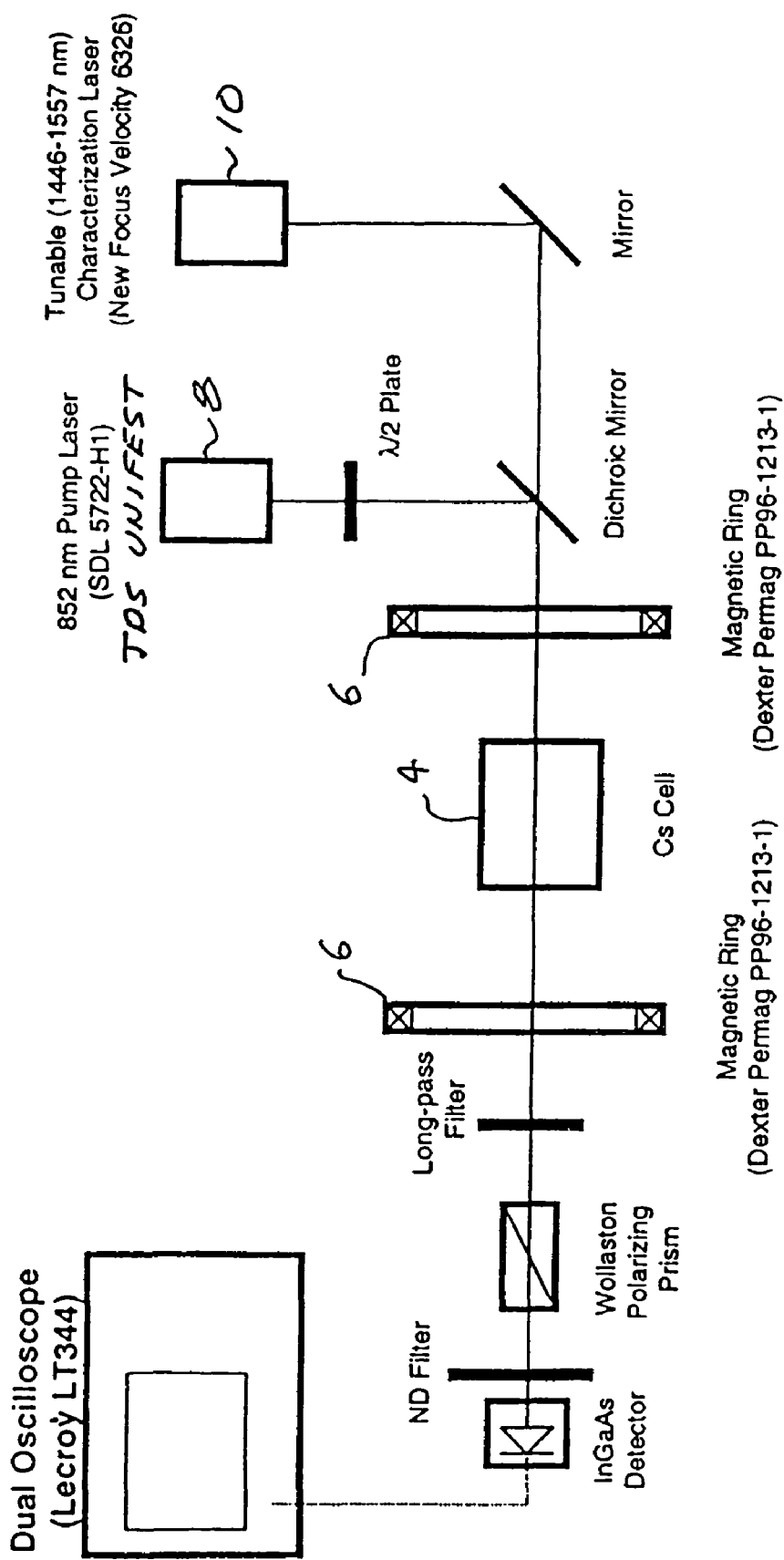
FIG. 1A shows a laboratory demonstration of the present invention with a cesium cell.
Figure 3:
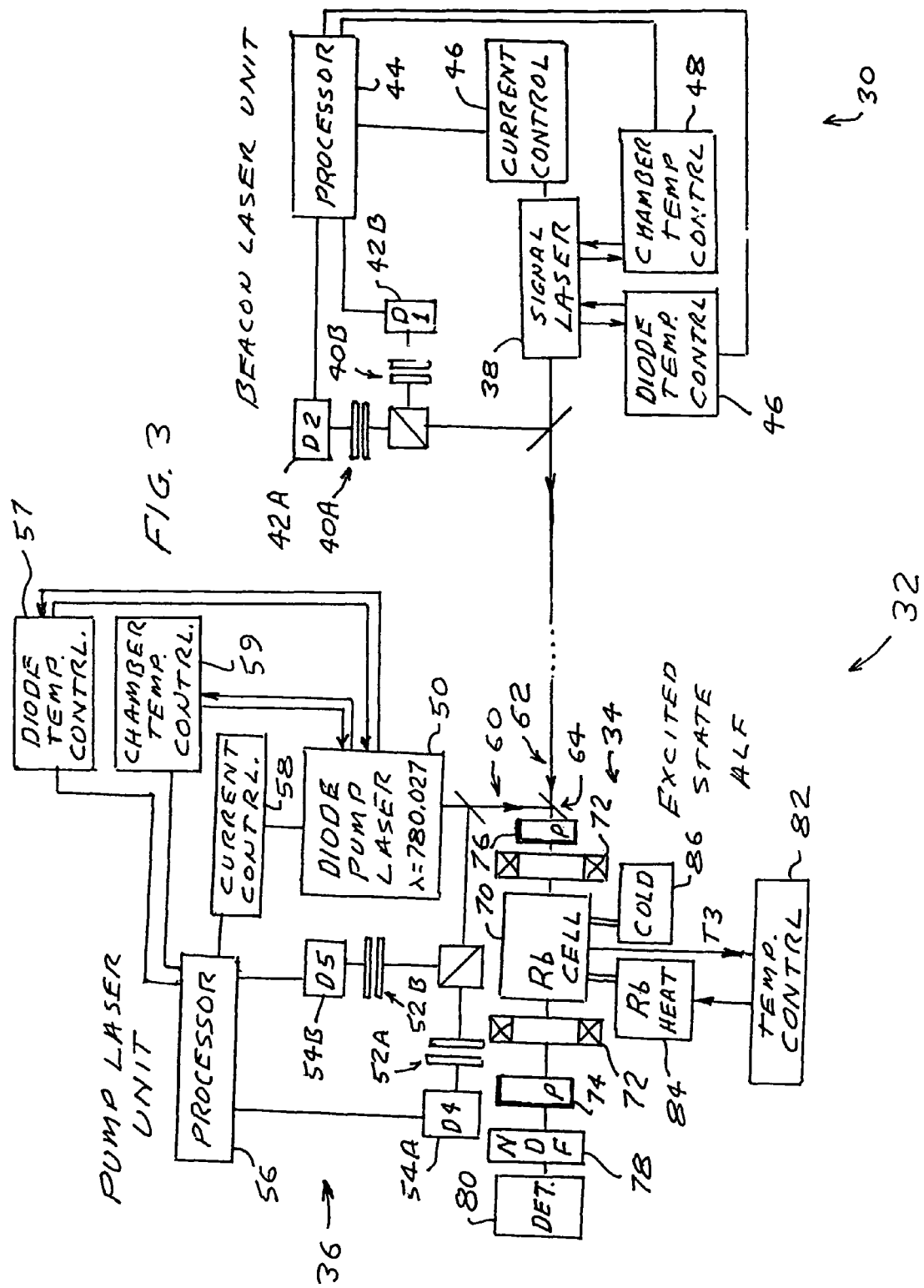
FIG. 3 is a drawing of a preferred embodiment of the present invention.

FIG. 1 shows a prototype layout used by Applicants to demonstrate the present invention. For this demonstration, a 10 mm long cesium cell, 4 containing cesium vapor at 157° C. is placed in a magnetic field of 150 Gauss produced by two ring magnets, 6 (Dexter Permag PP96-1213-1). The cesium vapor was excited with a 852 nm pump beam to the Cs $6^2P_{3/2}$ level as shown in FIG. 3 by pump laser 8 which is a diode laser supplied by SDL (now part of JDS Uniphase) (SDL 5722-H1). For this demonstration a tunable external cavity diode laser 10 (Near Focus Velocity 6326) is used for the signal beam so that a wide spectral range could be examined. The laser is tunable within the range of 1446-1557 nm. The output beam is linearly polarized. A long pass filter 12 blocks virtually all wavelengths below about 1.0 µm including light at the pump beam wavelength of 852 nm and Wallaston polarizing prism 14 is arranged with its polarization direction perpendicular to the polarization direction of the signal beam from tunable laser 10. Neutral density filter 16 reduces the intensity of light across a broad spectrum to match the intensity of the signal light operating range of the test instruments. Thus, substantially all light is blocked except light from laser 10 which is polarization rotated within cesium cell 4.

Figure 2:
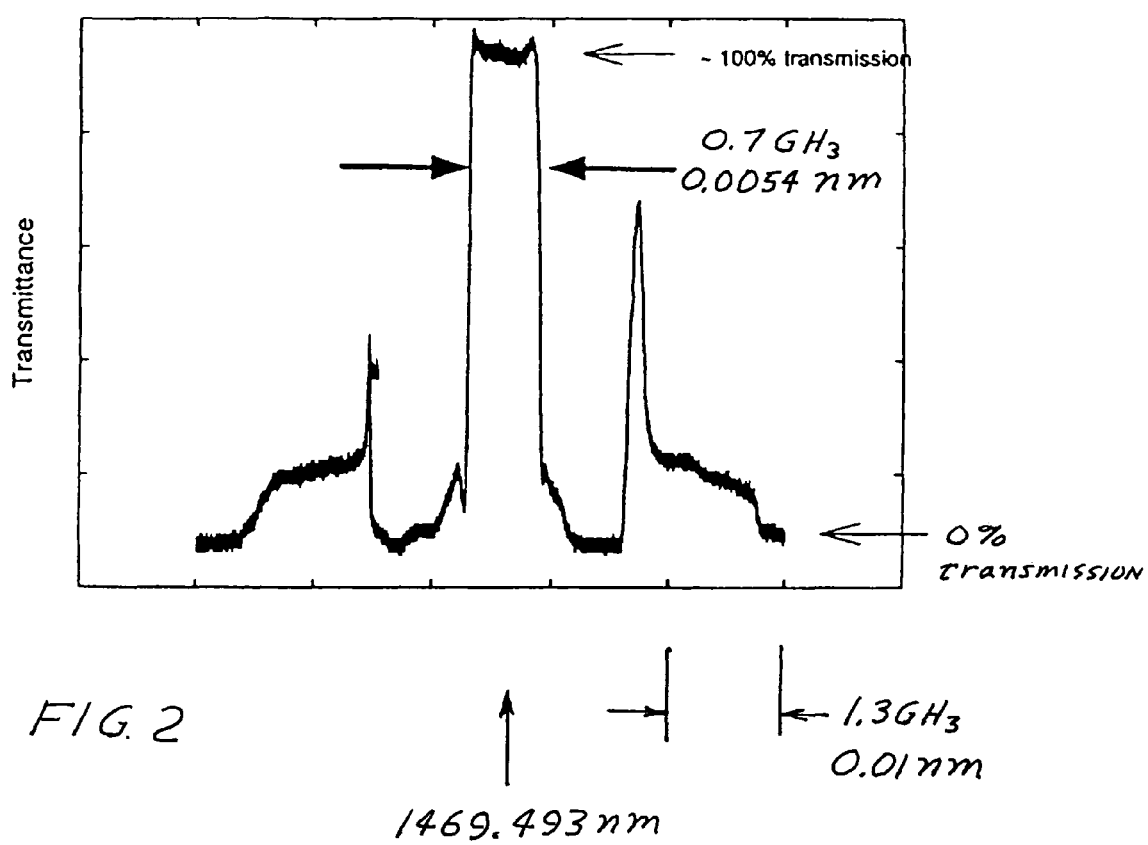
FIG. 2 is a transmission curve at approximately 1469.49 nm with the cesium cell.

FIG. 2 shows the results obtained by scanning the laser through the range of about 0.05 nm centered at 1469 nm. As is evident from the figure almost 100% of the light with a wavelength band of less than 0.01 nm is transmitted with substantially zero transmission outside a band of about 0.05 nm. The two side lobes shown in FIG. 2 would produce some noise but in many application this would be insignificant.

Rubidium Vapor

Figure 1B:
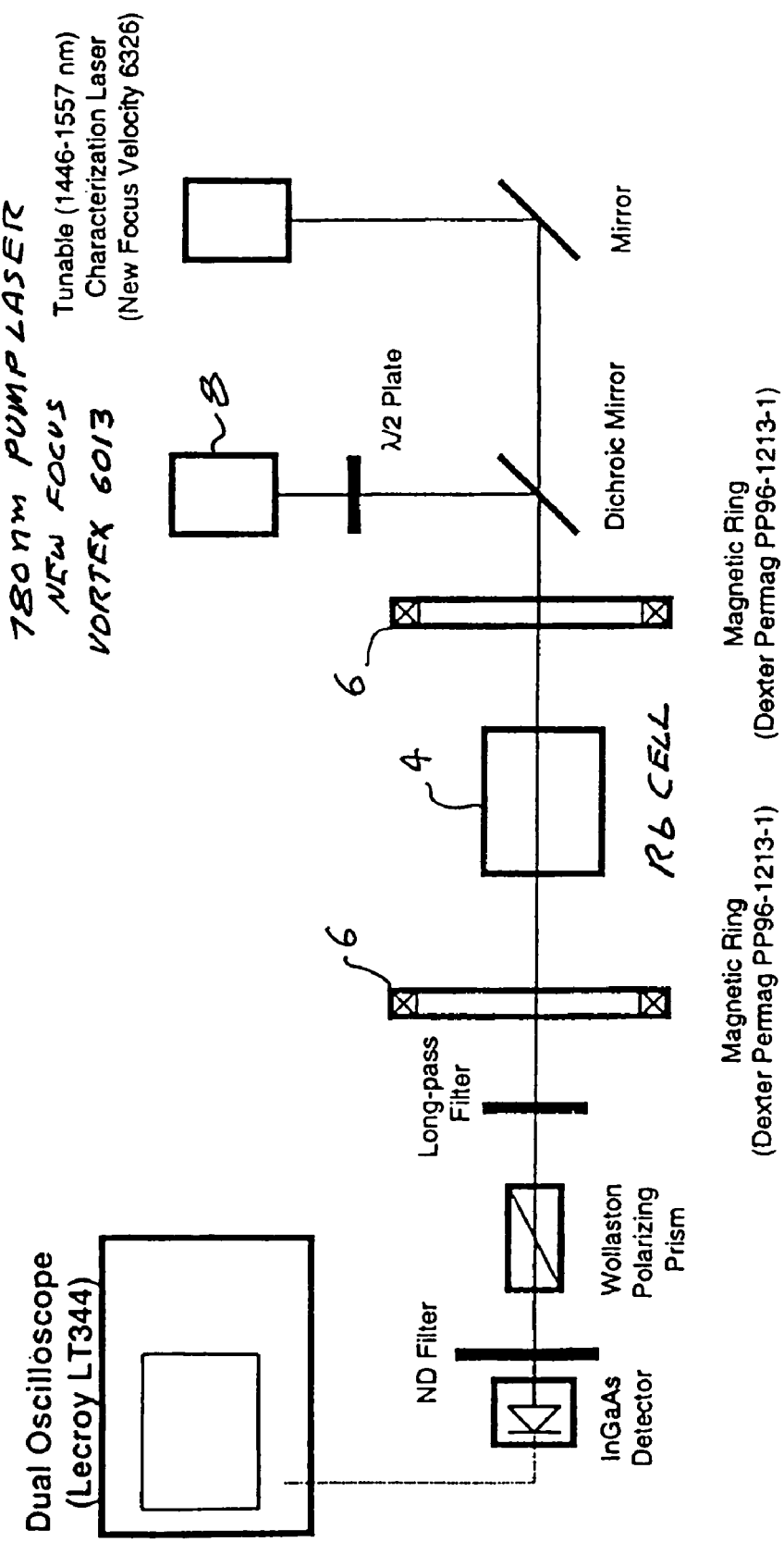
FIG. 1B shows a laboratory demonstration of the present invention with a rubidium cell.
Figure 5:
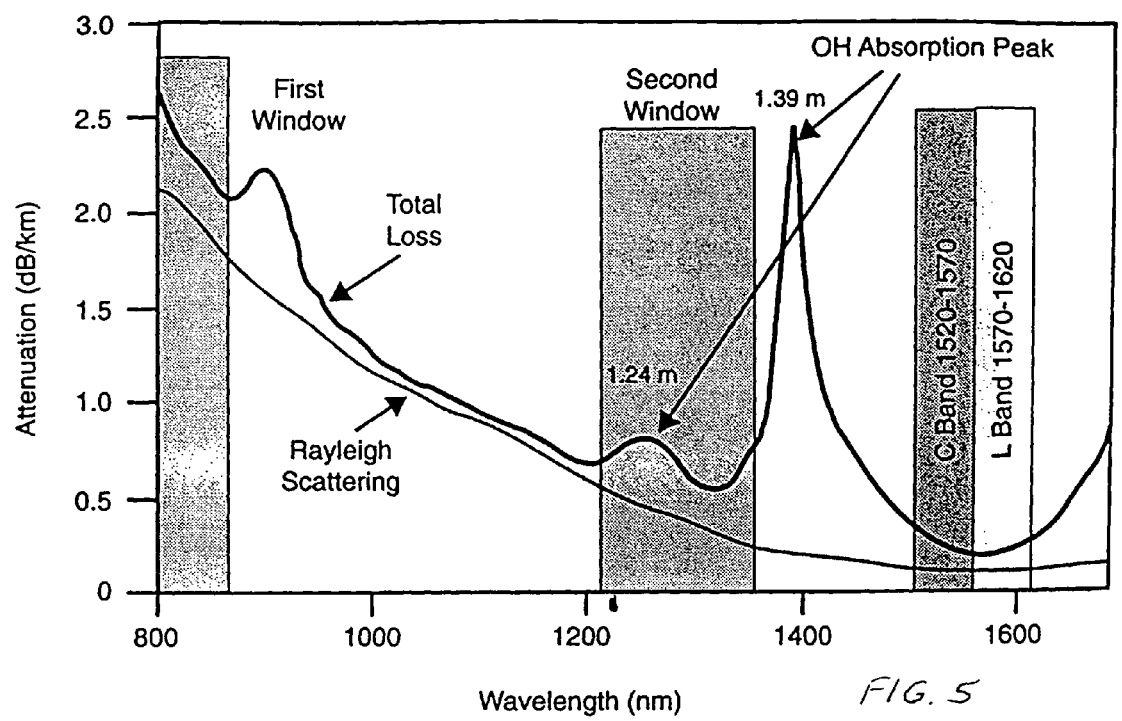
FIG. 5 shows wavelength bands in wide use for fiber optic communication.

A second bench top experiment was conducted using a rubidium cell. This experiment was very similar to the cesium cell experiment and is shown in FIG. 1B. The only difference is that the vapor cell 4 is a rubidium vapor cell and the pump laser is a 780 nm pump laser model Vortex 6013 supplied by New Focus with offices in San Jose, Calif. and the half wave plate 9 is chosen to correspond to the 780 nm wavelength. The results were equivalent to those shown for the co-experiment. This experiment shows that an atomic line filter can be provided in accordance with the present invention to provide an excellent filter for the very important C band of fiber optics communication. See FIG. 5.

Wavelength Locking

To fully utilize the excited atomic line filters of the present invention, the signal laser frequency must be stabilized within the transmission bandwidth of the filters during operation which may encounter temperature drift, vibration and mechanical shock. Efforts have been put forwards to stabilize the laser frequency, the success, however, is limited up to date. Earlier wavelength locker design described in prior art patents cited in the Background section utilized an extended cavity laser with an ALF inside the cavity. Applicants have discovered that this design is sensitive to vibration and mechanical shock. The laser is scanned in frequency to locate the peak ALF transmission position. The laser is then periodically scanned and tuned to keep the frequency at the peak transmission position. Additional complications results from the fact that the laser frequency is very sensitive to the laser diode temperature which is affected not only by the environmental temperature, but also by the tuning of the laser current.

Figure 10A:
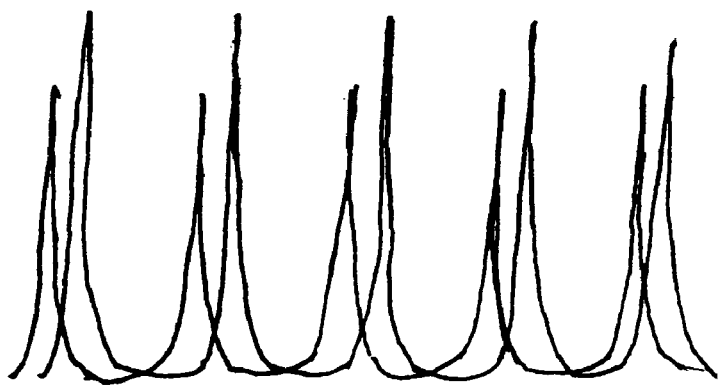
FIG. 10A shows etalon data.
Figure 10B:
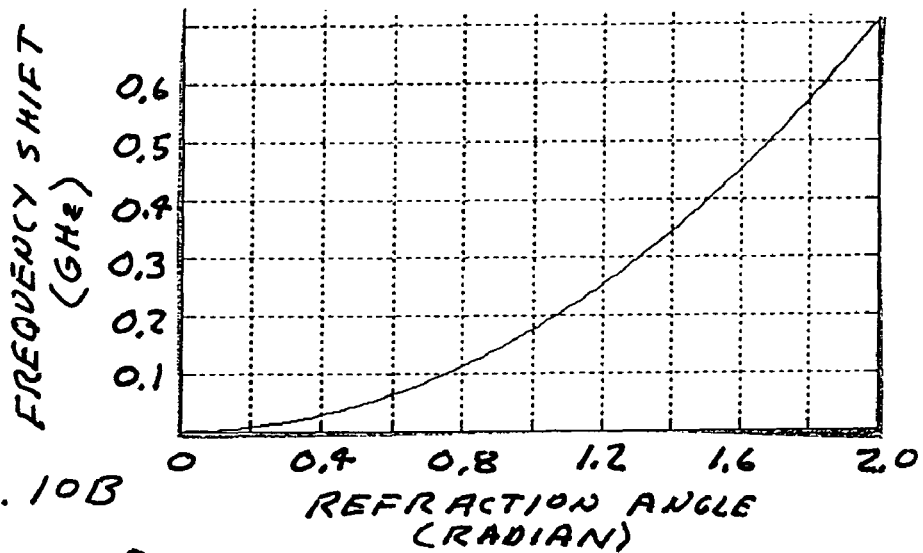
FIG. 10B shows etalon data.
Figure 10C:
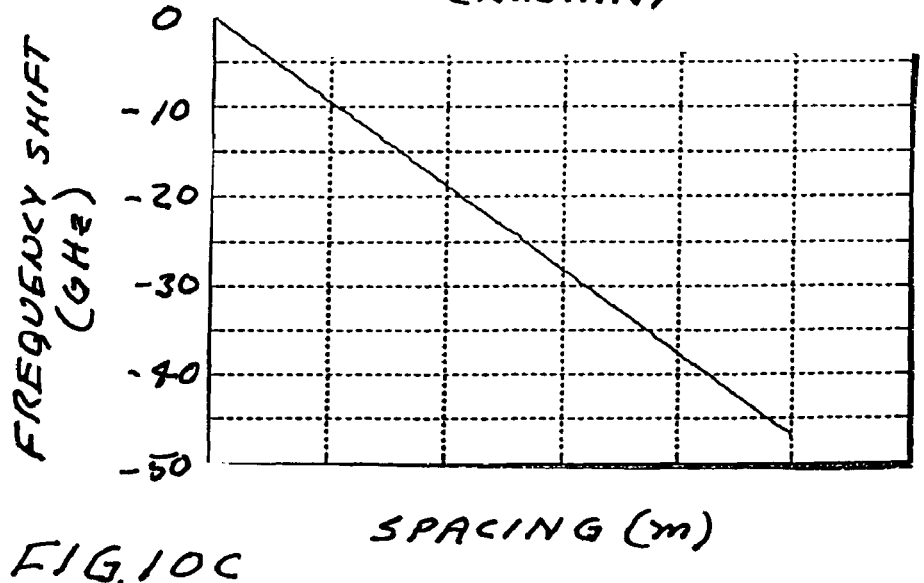
FIG. 10C shows etalon data.

Preferred embodiments of the present invention employ a pair of micro-etalons in order to provide frequency locking of the signal laser. Preferably the transmission peaks of the etalons differ by the full width at the half maximum (FWHM) of the transmission band of the atomic line filer and the peak frequency of one of the etalon is located at one side of the filter transmission band and the peak frequency of the other etalon is located at the other side of the filter transmission band. The laser wavelength is locked at the middle of the pair of the transmission bands. FIG. 10A shows the simulated etalon transmission spectra of a pair of etalons by CVI Technical Optics. The peak transmission of each of the etalons can be adjusted by changing the etalons spacing and/or charging the angular position of the etalon relative to the sample beam as shown in FIGS. 10B and 10C. Etalon performance is also affected by temperature and pressure changes.

Several parameters need to be considered in designing an etalon:

a) Transmission Wavelength and Free Spectra Range

An etalon is compose of two highly reflective parallel surfaces with the medium between the two surfaces either air or solid. Etalon transmissions are results of multiple beam interference. The transmitted wavelength is determined by $$\lambda = (2 \cdot n' \cdot h \cdot \cos \theta')/m$$

where, n' is the index of refraction of the medium in the etalon gap; h is the thickness of the etalon gap; θ' is the refraction angle inside the medium; and m is the interference order. The transmission peaks are equally spaced in frequency with frequency spacing, the so-called free spectra range (FSR), determined by $C/(2 \cdot n' \cdot h \cdot \cos \theta')$, where C is the speed of light. The transmission wavelength for a given interference order can be tuned by varying the angle of refraction, or the spacing of the etalon, or index of refraction of the material in the space between the surfaces that material is typically a gas such as air and n is affected by the pressure and temperature of the gas. FIGS. 10B and 10C plot the frequency shift of the transmission band with angle of refraction and etalon spacing, respectively, for an air-spaced etalon with 7.5 mm spacing or 20 GHz FSR at 852 nm central transmission wavelength. To achieve sub 100 MHz resolution angle-tuning of the transmission band, the required angular control accuracy is on the order of hundreds of micro radian.

b) FWHM and Finesse

The finesse (f) of the etalon defined as the FSR divided by the FWHM of the transmission bands is only determined by the reflectance (R) of the etalon $$f = \frac{\pi\sqrt{R}}{1-R}$$

The larger the reflectance, the larger the finesse and therefore narrower transmission bandwidth for a given spacing or FSR. To produce a FWHM of 0.5 GHz at 780 nm with a FSR of 25 GHz, the required reflectance is about 94%. In practice, defects in Optics will deteriorate the finesse of the etalons producing a somewhat wider transmission band.

c) Thermal Stability

Etalons can be air-spaced or solid. For better thermal performance, air-spaced etalons are the choice because the spacers can be made of temperature insensitive materials such as Zerodur. The cavity may also be sealed to reduce index of refraction fluctuation with temperature. The quoted thermal stability frm WavePrecision Inc. is −0.007 GHz/° C. for sealed air-spaced etalons made of Zerodur.

Preferred etalons are air-spaced with 7.690 mm spacing which results in a free spectra range (FSR) of 19.5 GHz. The reflectivity of the coating is 90% at 780 nm, which leads to a finesse of 31. The corresponding FWHM of the transmission bands is about 0.7 GHz.

Figure 10D:
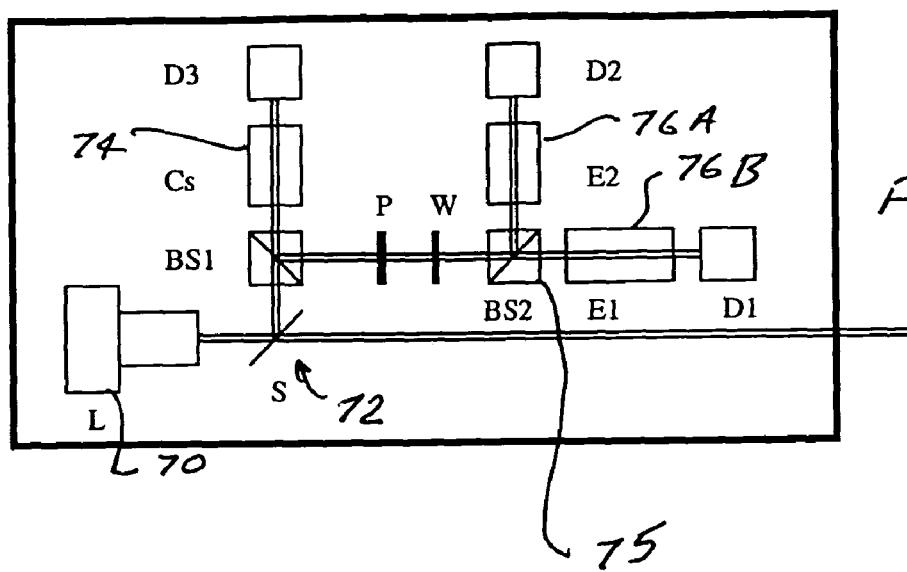
FIG. 10D shows a laboratory demonstration of a signal laser locking technique.

A schematic diagram of a wavelength locker for locking a diode laser is shown in FIG. 10D. Mini etalons and micro optics are used. The output from laser diode 70 is first collimated. A few percent of the collimated beam will be then picked off by beam splitter 72 for wavelength locking. The sampled beam will be split into two beams, one of which will be sent to a small absorption cell 74 of atomic vapor for absolute wavelength tuning of the laser wavelength, another beam will be sent to the etalon pair assembly 76A and 76B for wavelength locking signals from detection D1, D2 and D3 are used for tuning the etalon on both sides of the absorption peak. The whole package will be temperature-controlled with a TE cooler. The reader should not that once etalons have been tuned and locked in place, the absorption cell may no longer be needed. Also, for locking the beacon laser, the atomic line filter is preferably used for absolute tuning.

APPLICATIONS

Laser Tracking

Figure 8:
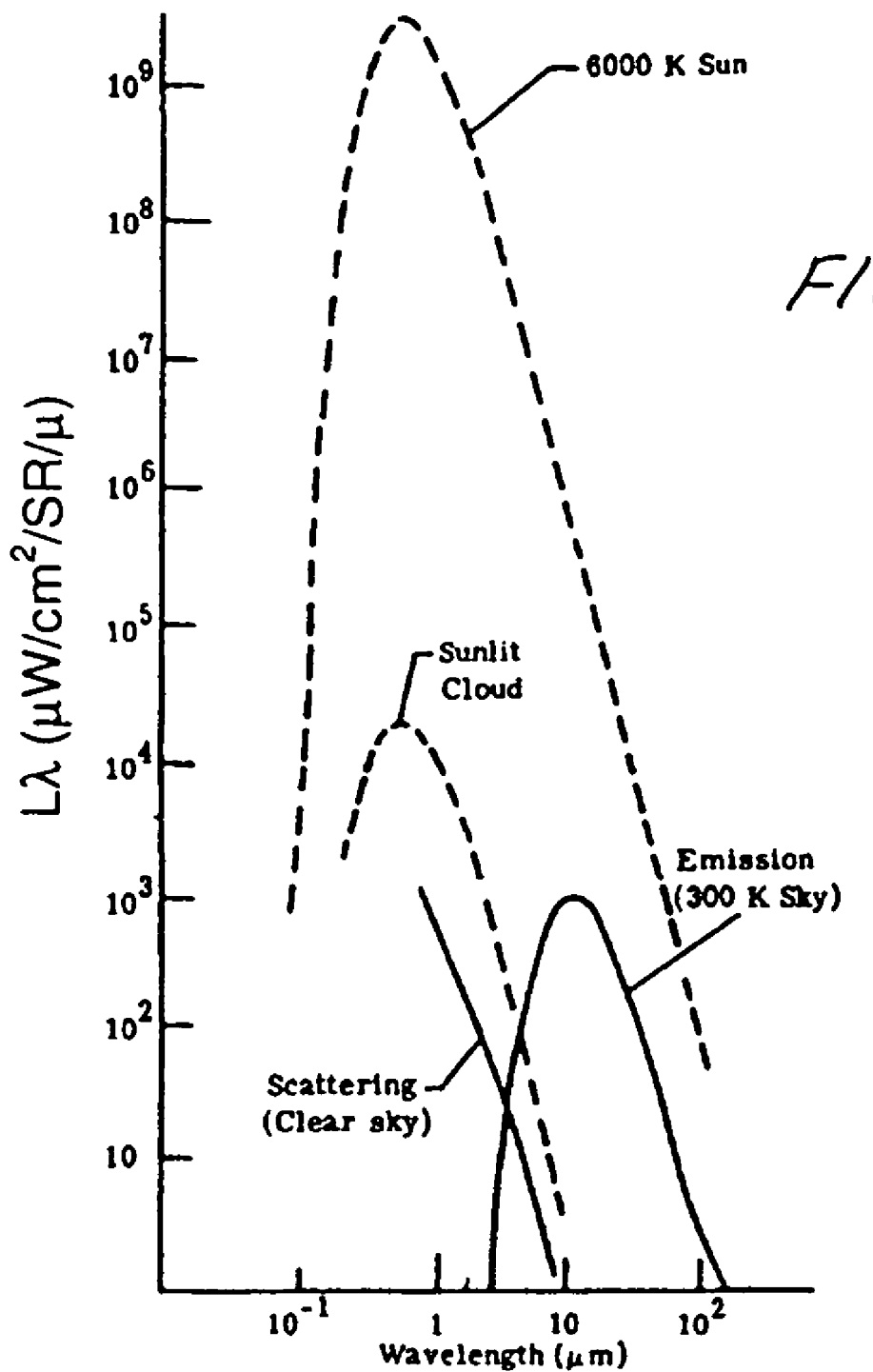
FIG. 8 shows background spectral data.
Figure 9:
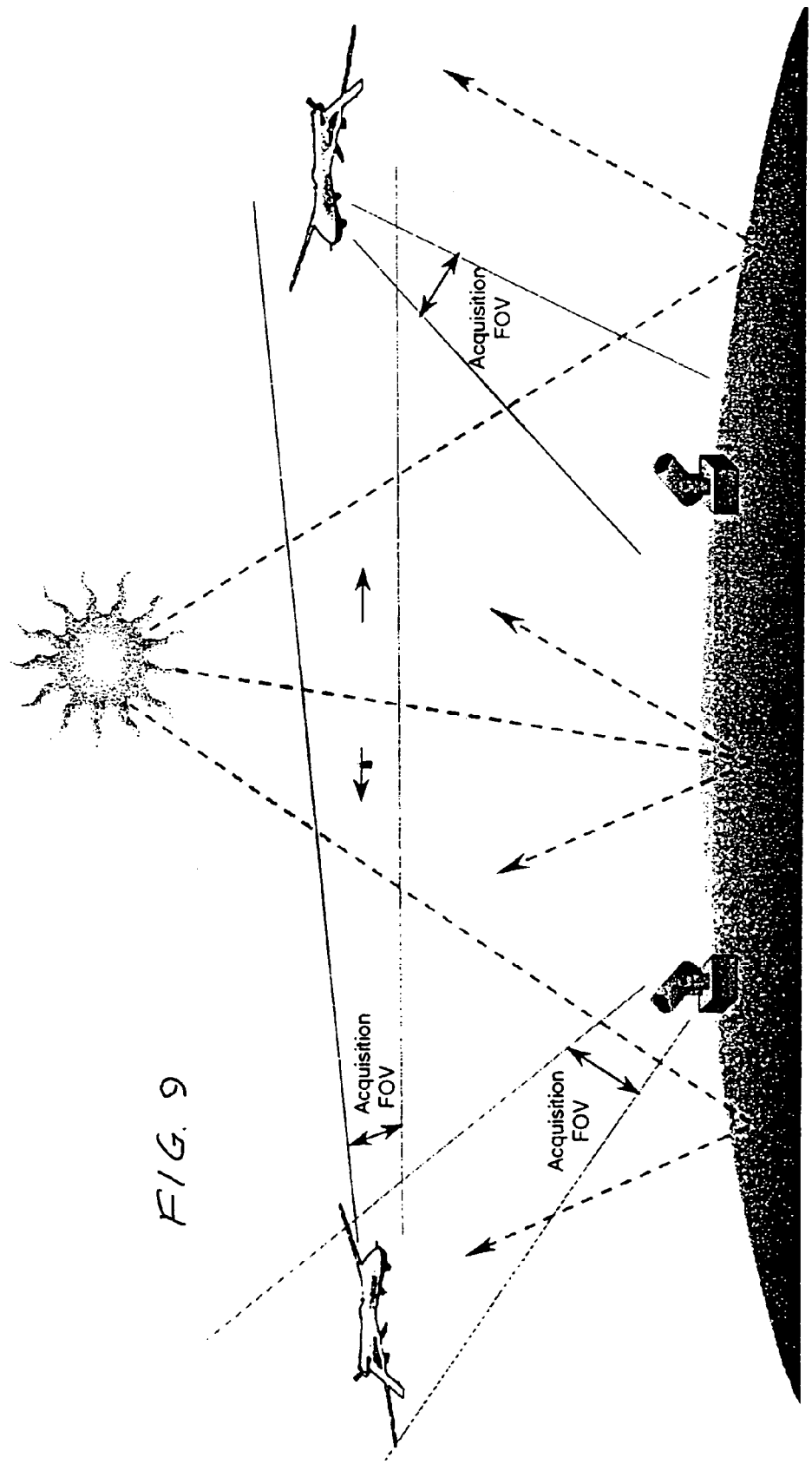
FIG. 9 shows an application of the present invention.

A preferred application of the present invention is for laser tracking of a moving target. In this case the moving target may utilize a relatively wide divergence beacon laser which is tracked by a tracking detector which includes one or more filters such as one of those described above. The beacon laser system should be stabilize the beacon laser at the specific wavelength band of the very narrow band filter. In this case, a very narrow band filter is needed so that reflected and scattered sunlight can be filtered out. FIG. 8 shows examples of spectral background looking directly at the sun 80, looking at a sunlit cloud 82, scattering from a clear sky and emission from a clear sky. A tracking system must compete with this light and must produce a sufficient signal to noise ratio to stay on track. FIG. 9 is a drawing showing ground-to-air tracking. The technique used is to provide a beacon laser operating at or within a precise wavelength range with a wide enough angle to be relatively certain of including the tracking system.

This provides the tracking system with a narrowband filter which will be as efficient as possible at the beacon laser wavelength and as narrow enough so as to discriminate sufficiently against background light so that the signal to noise ratio is large enough to permit tracking.

Dielectric optical bandpass filters typically achieve bandwidths of 0.5% to 1% of the center wavelength, and suffer from increased transmission loss with decreasing bandwidth, limited acceptance angle, and wavelength shift with temperature. Atomic line filters have demonstrated superior performance with bandwidths less than 0.02 nm, greater than 30 degree acceptance angle, and little or no dependence upon temperature. However, these filters are limited to wavelengths in the visible and near visible (<853 nm). A new excited state Faraday resonance filter of the present invention extends conventional proven atomic line filter techniques to the 1550 nm region. This filter provides increased background reduction of >100 over the best optical filters without the angular field of view and temperature shift limitations of dielectric optical filters.

For negligible electronic noise, an FPA used in beacon acquisition will have an SNR given by $$SNR = \left[\frac{\eta P_s}{2h\nu\Delta f(1+P_b/P_s)}\right]^{1/2}$$

where $P_s$ is the per pixel detected signal power, $P_b$ is the per pixel background power and $\Delta f$ is the sensor integration bandwidth. For background limited performance it can be shown that the IFOV $$\theta = \left(\frac{P_s/A}{\Delta\lambda L_\lambda}\right)^{1/2}$$

when $P_s=P_b$, $\Delta\lambda$ is the bandpass, A is the pixel area, and $L_\lambda$ is the background radiance (W/cm$^2$/SR/μ). This important result shows that decreasing the optical filter bandwidth by a factor of 100 will allow the received beacon power density to be decreased by 100 for the same sensor field of view and background power density. Or, alternatively, will allow 100× more solid angle to be illuminated thereby decreasing search time.

Dielectric bandpass filters having narrow bandwidths will have center transmission wavelength shift with angle of incidence (θ) proportional to $\sin^2\theta$. For a SOTA filter of 0.1% bandwidth, this shift would exceed the bandwidth for an angle of incidence of 10 degrees (FIG. 2). Thus the new ultra-narrow filters being made for fiber DWDM systems (ie 0.1% BW) will not meet the viewing angle requirements needed for an acquisition sensor. The 1.55 micron atomic line filter described above can readily achieve 1/100 of this bandwidth (0.02 nm ≈1550 nm) with greater than 30 degree acceptance angle and 80% transmission.

PREFERRED EMBODIMENT

Details of the principal components and features of a preferred embodiment of the present invention are shown in FIGS. 3, 3A, 3B, and 3C. This embodiment includes a beacon laser unit 30 that might be located on a moving platform such as an unmanned aerial vehicle such as those shown in FIG. 9. It also includes excited state atomic line filter unit 32 comprising rubidium ALF 34 and pump laser unit 36.

The beacon laser unit comprises diode signal laser 38, frequency locking etalons 40A and 40B, and detectors 42A and 42B providing frequency locking signals to processor 44 which utilizes those signals to control the current to signal laser 38 through current control 46. Processor 44 also maintains control of the diode temperature and the chamber temperature through thermoelectric coolers (not shown) and diode temperature control unit 46 and chamber temperature control unit 48.

Figure 6A:
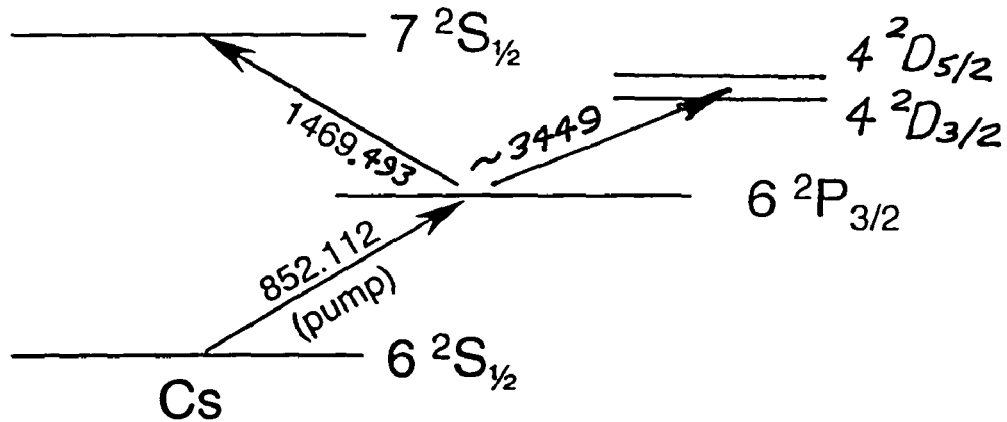
FIG. 6A shows some atomic transmission for cesium and rubidium.
Figure 6B:
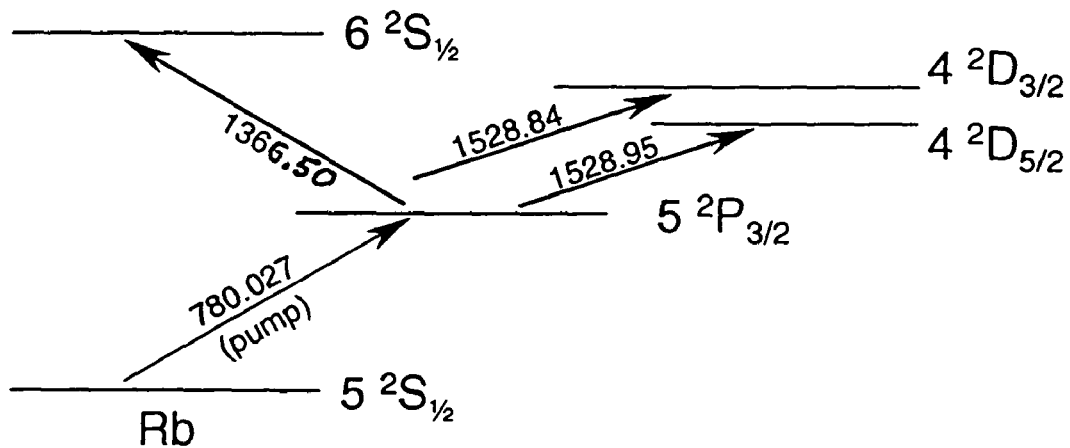
FIG. 6B shows some atomic transmission for cesium and rubidium.

Pump laser unit 36 provides a laser beam locked precisely to a wavelength $\lambda=780.027$ nm to excite rubidium vapor in vapor cell 70 to the $5^2P_{3/2}$ excited state as shown in FIG. 6B. Controls for this laser are similar to those for beacon laser 30. The unit includes diode pump laser 50, frequency locking etalons 52A and 52B and detectors 54A and 54B providing frequency locking signals to processor 56 which utilize these signals to control the current to pump laser 50 through current control 58. Processor 56 also maintains control of the diode temperature and the chamber temperature through thermoelectric coolers (not shown) and diode temperature control unit 57 and chamber temperature control unit 59. The output beam 60 of pump laser unit 36 is co-aligned with beacon beam 62 from beacon laser 30 using dichroic mirror 64.

Rubidium atomic line filter 34 comprises rubidium cell 70, two ring magnets 72 producing a 150 Gauss co-axial magnetic field through cell 70, cross polarizers 74 and 76, long pass filter 78 and detector 80. Temperature controller 82 controls the temperature of cell 70 via rubidium heater 84. Cold finger 86 provides a condensation location within the cell to maintain a rubidium vapor-liquid equilibrium within cell 70. The signal from detector as shown at 88 may be utilized by pointing equipment (not shown) to maintain a telescope such as those shown in FIG. 9 pointed at beacon laser 30.

Figure 3A:
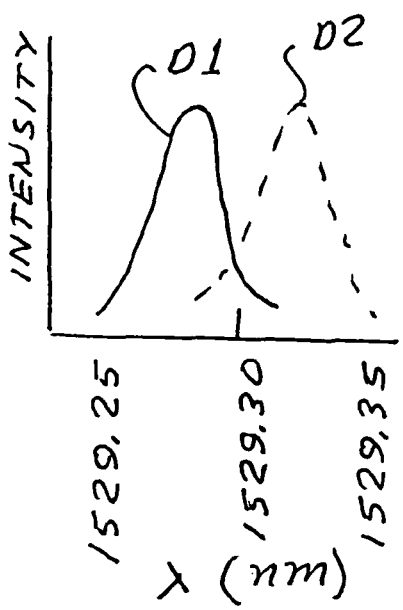
FIG. 3A shows wavelengths locking features using dual etalons.
Figure 3B:
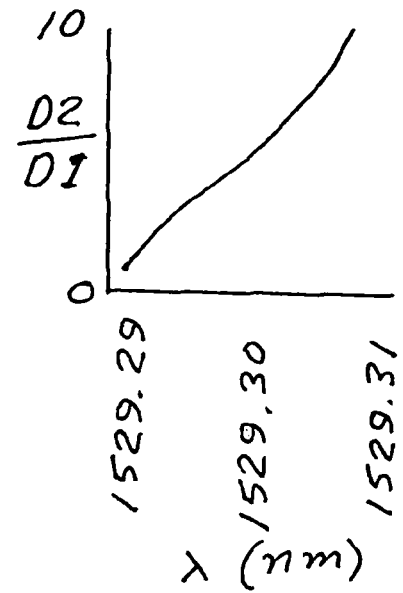
FIG. 3B shows wavelengths locking features using dual etalons.

FIG. 3A provides a qualitative representation of the output of detection D1 and D2 of beacon signal laser 30 as a function of the output wavelength of beacon signal laser 38. FIG. 3B shows qualitatively the relationship between the ratios of the detector signals to the wavelength within the narrow spectral range of about 1529.29 nm to about 1529.31 nm. Current to diode laser 38 is adjusted to maintain the output of beacon laser 38 precisely within the transmission band of filter unit 32 as shown in FIG. 3F.

Figure 3C:
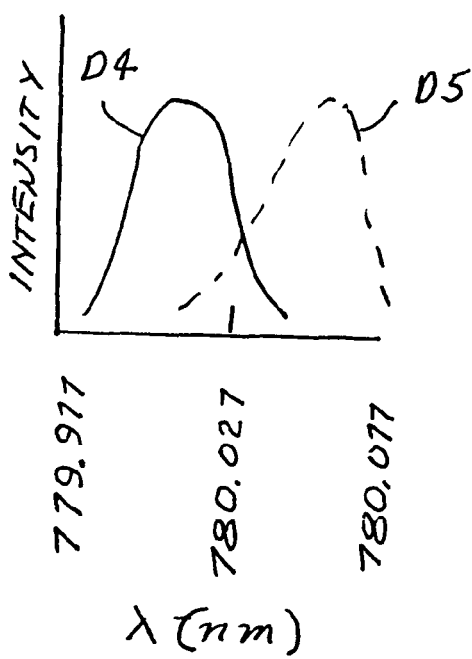
FIG. 3C shows wavelengths locking features using dual etalons.
Figure 3D:
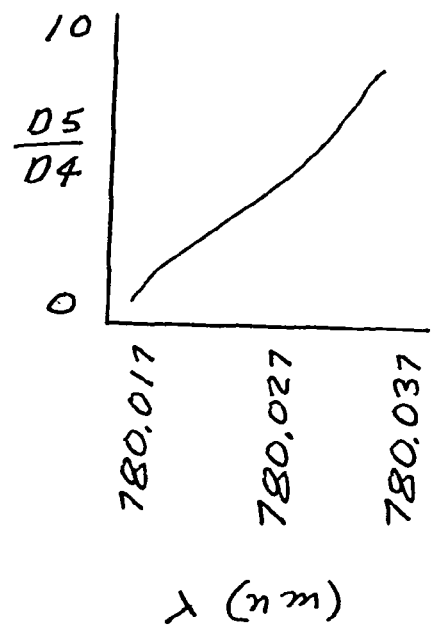
FIG. 3D shows wavelengths locking features using dual etalons.
Figure 4:
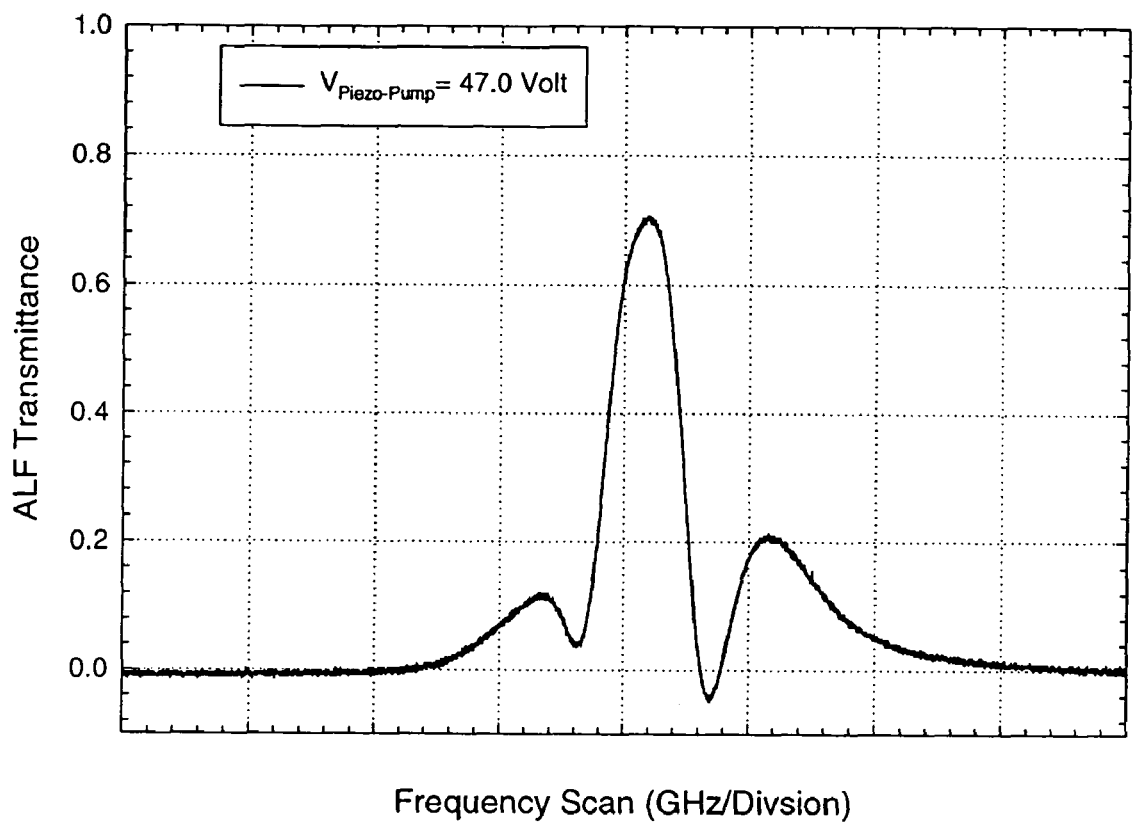
FIG. 4 shows actual transmission curve at 1529.3 nm for the rubidium cell laboratory demonstration.

FIGS. 3C and 3D are similar graphs demonstrating the control of the wavelength of the pump laser beam from pump laser unit 36. This wavelengths can also be controlled to a precession of about ±0.0005 nm. Specification for pump 36 laser provide a response of 0.0034 nm per milliamps permitting wavelength precision to about ±0.0005 nm.

Alignment and Packaging Procedure

The alignment and packaging process for both the pump laser and the beacon laser should be performed in a well controlled environment so that the laser wavelength will be stable to about 100 MHz even without wavelength locking in a period of one hour or so. At first all components other than the two etalons will be aligned and fixed to positions either mechanically or using thermal/UV curing epoxy. The two etalons will be attached to two precession (100μ radian or better resolution) angular alignment stages, respectively, by mechanical or vacuum means. The beacon laser is scanned to obtain an ALF transmission spectrum and the pump laser is scanned to obtain an absorption spectrum. For the beacon laser, the two etalons will be angularly-tuned so that their transmission spectra overlaps at the center of the ALF spectrum. For the pump laser, the transmission spectrum of the two etalon overlap at the center of the absorption spectrum. The etalons will be fixed to positions with UV epoxy.

Control Electronics and Operation Procedure

A microprocessor will be used to control the laser current and process the outputs from the two etalon-photodiodes. The diode laser TE cooler, the atomic vapor cell heater, and the TE cooler for the whole package may also be controlled with the microprocessor.

To operate the wavelength locker, at first all temperature controls should be stabilized with the laser current ramped up to the operation value. The laser wavelength will then be locked to the position by balancing the light output from the two etalons through the tuning of the laser current with the microprocessor.

Packaging

The etalons will be made of temperature-insensitive materials and the whole package may be temperature-controlled as well. So thermal stability should not be a critical issue. However, as shown in FIG. 10B, the peak transmission frequency of the etalons is very sensitive to angle of incident. To lock the laser frequency better than a few hundreds of MHz, the incident beam should be stabilized better than 1 mradian. To reduce spatial jitter of the incident beam from the beacon laser to the wavelength locker, the whole package should be made of small size components with dimensions on the order of a few centimeters. Furthermore, the beacon laser and the line locker should be integrated into one small package.

While the above description describes specific preferred embodiment of the present invention, person skilled in this art should understand that many changes and modifications could be made within the scope of the present invention. For example, vapors other than rubidium and cesium could be used. Specifically, other alkali metals are good choices, where a desirable resonant frequency exists between two excited states and where the vapor can be pumped to the first excited state. Good application of the present invention includes tracking a transceiver in a laser communication system. Also, the system may be used to track hot objects such as bullets or other missiles emitting radiation at infrared wavelengths.

Another application is for laser radar systems where eye safety is a concern. For these reasons the reader should determine the scope of the invention from the appended claims and their legal equivalence.

What is claimed is:

1. A tracking system comprising:
   (A) a tracking unit comprising an excited state atomic line filter comprising a metal vapor cell having an optical entrance port and an optical exit port and containing a metal vapor defining a first excited energy state, defining a first resonant frequency, and a second excited energy state and having at least one absorption line, at or near a desired filter wavelength within an infrared spectral range, said absorption line being equal, in energy, to a difference between the second excited state and the first excited state, (B) a beacon laser system, located on a platform to be tracked by said tracking unit, for producing a beacon laser beam at a wavelength within said narrow spectral band (C) a diode laser to pumping said metal vapor cell, wherein said excited state atomic line filter further comprises two frequency locking etalons and two frequency locking detectors for monitoring frequency of said pump beam.

2. The tracking system as in claim 1 wherein said two etalons are tuned to produce transmission peaks on both sides of said first resonant frequency and feedback control to maintain said diode laser operation at said resonant frequency based on input signals from said two frequency locking detectors.

3. A tracking system as in claim 1 wherein said beacon laser system comprises:
A) a diode laser,
B) two frequency locking etalons and two frequency locking detectors for monitoring frequency of said beacon laser beam and
C) feedback control components to maintain said wavelength of said beacon laser beam within said narrow spectral band of the excited state atomic line filter.

4. A tracking system as in claim 2 wherein said beacon laser system comprises:
A) a diode laser,
B) two frequency locking etalons and two frequency locking detectors for monitoring frequency of said beacon laser beam and
C) feedback control components to maintain said wavelength of said beacon laser beam within said narrow spectral band of the excited state atomic line filter.

5. The tracking system as in claim 4 wherein said two etalons are tuned to produce transmission peaks on both sides of said first resonant frequency and feedback control to maintain said diode laser operation at said first resonant frequency based on input signals from said two frequency locking detectors.

6. The tracking system as in claim 5 wherein said beacon laser is configured to produce a beacon laser beam with a divergence of at least 20 degrees.

7. A tracking system comprising:
A) an atomic line filter comprising:
1) a metal vapor cell having an optical entrance port and an optical exit port and containing a metal vapor defining a first excited energy state, defining a first resonant frequency, and a second excited energy state and having at least one absorption line, at or near a desired filter wavelength within an infrared spectral range, said absorption line being equal, in energy, to a difference between the second excited state and the first excited state;
2) at least one magnet for imposing on said metal vapor a magnetic field to produce polarization rotation near said at least one absorption line;
3) a first polarizer positioned to block polarized light at a first polarization from entering said vapor cell through said entrance port;
4) a second polarizer oriented perpendicular to said first polarization and located across the path of light exiting said exit port so as to block light exiting said vapor cell that is polarized perpendicular to said first polarization;
5) a pump light source for producing light at said first resonant frequency for pumping said metal vapor from said ground state to said first excited state;
wherein said metal vapor under the influence of said magnetic field produces a polarization rotation of light within a narrow spectral band near said absorption line permitting light within this spectral band to pass through said second polarizer whereas all light in a much wider spectral range is not rotated in polarization and is blocked by either the first polarizer or the second polarizer;

B) a beacon laser located on a platform to be tracked by said tracking unit, for producing a beacon laser beam at a wavelength within said narrow spectral band, said beacon laser system comprising:
1) a diode laser,
2) two frequency locking etalons and two frequency locking detectors for monitoring frequency of said beacon laser beam and
3) feedback control components to maintain said wavelength of said beacon laser beam within said narrow spectral band.

8. The tracking system as in claim 7 wherein said pump light source in said excited state atomic line filter is a pump laser system.

9. The tracking system as in claim 8 wherein said pump laser system is a diode laser system producing a pump beam 10. The tracking system as in claim 9 wherein said diode laser further comprises two frequency locking etalons and two frequency detectors for monitoring frequency of said pump beam.

11. The tracking system as in claim 10 wherein said two etalons are tuned to produce transmission peaks on both sides of said first resonant frequency and feedback control to maintain said diode laser operation at said resonant frequency based on input signals from said two frequency locking detectors.

12. The tracking system as in claim 11 wherein said metal vapor is an alkali metal.

13. The tracking system as in claim 11 wherein said metal vapor is rubidium.

14. The tracking system as in claim 13 wherein at least one magnet is two permanent magnets.

15. The tracking system as in claim 14 wherein said two permanent magnets are two ring magnets.

16. The tracking system as in claim 7 wherein said at least one magnet comprises an electromagnet.

17. The tracking system as in claim 12 wherein said vapor cell defines beam direction and at least one magnet is oriented to produce a magnetic field parallel to said beam direction.

18. The tracking system as in claim 12 wherein said vapor cell defines a beam direction and said at least one magnetic is oriented to produce a magnetic field perpendicular to said beam direction.

* * * * *